(12) United States Patent  
Van De Graaff

(10) Patent No.: US 6,665,232 B2  
(45) Date of Patent: Dec. 16, 2003

(54) SYNCHRONOUS MIRROR DELAY WITH REDUCED DELAY LINE TAPS

(75) Inventor: Scott Van De Graaff, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/369,994

(22) Filed: Feb. 20, 2003

(65) Prior Publication Data

US 2003/0133345 A1 Jul. 17, 2003

Related U.S. Application Data

(62) Division of application No. 09/865,743, filed on May 25, 2001, now Pat. No. 6,570,813.

(51) Int. Cl.[7] .................................................. G11C 8/00
(52) U.S. Cl. .................... 365/233; 365/194; 365/230.08
(58) Field of Search ................................ 365/233, 190, 365/194, 189.05, 189.08, 230.08

(56) References Cited

U.S. PATENT DOCUMENTS

| | | | |
|---|---|---|---|
| 5,352,945 A | 10/1994 | Casper et al. | |
| 5,428,310 A | 6/1995 | Casper et al. | |
| 5,555,166 A | 9/1996 | Sher | |
| 5,598,156 A | 1/1997 | Hush et al. | |
| 5,644,538 A | 7/1997 | Merritt | |
| 5,692,165 A | 11/1997 | Jeddeloh et al. | |
| 5,748,542 A | 5/1998 | Zheng et al. | |
| 5,818,788 A | 10/1998 | Kimura et al. | |
| 5,819,076 A | 10/1998 | Jeddeloh et al. | |
| 5,854,615 A | 12/1998 | Hush | |
| 5,857,095 A | 1/1999 | Jeddeloh et al. | |
| 5,920,518 A | 7/1999 | Harrison et al. | |
| 5,923,613 A | 7/1999 | Tien et al. | |
| 5,926,047 A | 7/1999 | Harrison | |
| 5,930,182 A | 7/1999 | Lee | |
| 5,940,608 A | 8/1999 | Manning | |
| 5,940,609 A | 8/1999 | Harrison | |
| 5,946,244 A | 8/1999 | Manning | |
| 5,956,289 A | 9/1999 | Norman et al. | |
| 5,999,032 A | 12/1999 | Wang et al. | |
| 6,011,732 A | 1/2000 | Harrison et al. | |
| 6,016,282 A | 1/2000 | Keeth | |
| 6,023,429 A | 2/2000 | Mecier et al. | |
| 6,026,496 A | 2/2000 | Wright et al. | |
| 6,029,252 A | 2/2000 | Manning | |
| 6,044,026 A | 3/2000 | Morgan | |
| 6,069,506 A | 5/2000 | Miller, Jr. et al. | |
| 6,078,533 A | 6/2000 | Lee | |
| 6,081,462 A | 6/2000 | Lee | |
| 6,101,197 A | 8/2000 | Keeth et al. | |
| 6,101,612 A | 8/2000 | Jeddeloh | |
| 6,108,795 A | 8/2000 | Jeddeloh | |
| 6,111,812 A | 8/2000 | Gans et al. | |
| 6,115,318 A | 9/2000 | Keeth | |
| 6,137,325 A | 10/2000 | Miller, Jr. | |
| 6,137,334 A | 10/2000 | Miller, Jr. et al. | |
| 6,141,266 A | 10/2000 | Mecier et al. | |
| 6,141,272 A | 10/2000 | Van de Graaff et al. | |
| 6,150,856 A | 11/2000 | Morzano | |
| 6,160,755 A | 12/2000 | Norman et al. | |
| 6,166,576 A | 12/2000 | Stave | |
| 6,173,432 B1 | 1/2001 | Harrison | |
| 6,175,526 B1 | 1/2001 | Morgan | |
| 6,201,424 B1 | 3/2001 | Harrison | |
| 6,240,042 B1 | 5/2001 | Li | |
| 6,243,797 B1 | 6/2001 | Merritt | |
| 6,310,822 B1 | 10/2001 | Shen | |
| 6,449,212 B1 | 9/2002 | Toda et al. | |

*Primary Examiner*—Michael S. Lebentritt  
*Assistant Examiner*—Hien Nguyen  
(74) *Attorney, Agent, or Firm*—Leffert Jay & Polglaze, P.A.

(57) ABSTRACT

A synchronous mirror delay (SMD) clock recovery and skew adjustment circuit for an integrated circuit is described, having a reduced circuit implementation. The SMD clock recovery and skew adjustment circuit incorporates a delay segment into the forward delay line (FDL) and backward delay line (BDL) that accounts for all or some of the non-variable portion of the asserted clock signal time period. This delay segment allows reduction of the FDL and BDL lines to only those portions necessary to sense and adjust for the portion of the asserted clock signal time period that is variable and that must be adjusted for. The invention allows SMD clock recovery and skew adjustment circuits to be implemented in an optimized manner that exhibits a reduced overall circuit size.

62 Claims, 10 Drawing Sheets

SYNCHRONOUS MIRROR DELAY WITH REDUCED DELAY LINE TAPS

RELATED APPLICATION

This is a divisional application of U.S. patent application Ser. No. 09/865,743, filed May 25, 2001 now U.S. Pat. No. 6,570,813, titled "SYNCHRONOUS MIRROR DELAY WITH REDUCED DELAY LINE TAPS" and commonly assigned, the entire contents of which are incorporated herein by reference.

TECHNICAL FIELD OF THE INVENTION

The invention relates to integrated circuits, and more particularly, to synchronous mirror delay circuits with delay, line taps for double data rate (DDR) synchronous dynamic random access memory (SDRAM) devices.

BACKGROUND OF THE INVENTION

Memory access speed and the resulting data transfer bandwidth has been a typical bottleneck in computer systems and other digital applications. A newer type of dynamic random access memory (DRAM), known as a synchronous DRAM or SDRAM, has been developed to provide faster operation and improve memory access times. SDRAMs are designed to operate synchronously with the system clock with input and output data synchronized to an active edge of the system clock which is driving the processor accessing the SDRAM.

Although SDRAMs have overcome some of the timing disadvantages of other memory devices memory, access is still a limiting factor, and there is a need for still faster memory devices. With this in mind, double data rate (DDR) SDRAMs were developed to allow data transfers on both the rising and falling edges of the system data clock, providing twice the operating speed of the conventional SDRAM. Thus, DDR SDRAM provides up to twice as much data bandwidth as the conventional SDRAM for a given data clock. In addition, as with SDRAM, DDR SDRAMs are also capable of providing bursts of data at a high-speed data rate.

As clock frequencies increase, it is desirable to have less uncertainty when valid data is available on the output of the memory in DDR SDRAM. As shown in FIG. 1, due to the high speed data transfers DDR SDRAMs use a data strobe signal (DQS) 100 to register the data (DQ) 104 on both edges of the system clock 102. This allows the receiving system to improve latching the presented data under the timing constraints of modern high speed memory data transfers. According to industry standards, when data is being received by the DDR SDRAM, the DQS has a known latency 106, 108 which varies between ¾ of the system clock cycle (minimum latency) to 5/4 of the clock cycle (maximum latency). Because of this variability, and the above mentioned timing constraints of modern high speed memory data transfers, DDR SDRAMs utilize a clock skew adjustment circuit to drive this latency variability to as close to zero as feasible and synchronize the DQS signal and output data signals to the system data clock.

A common clock skew adjustment circuit utilized in DDR SDRAM is a delay locked loop (DLL), shown in FIG. 2. DLL's generally consist of a delay line 200 of individual delay elements, that generates a replica of a clock signal which is compared against the input clock signal. The clock signal loaded into the delay line 200 is iteratively adjusted until a match or "lock" is achieved. The delay line 200 is coupled to a shift register 202 that loads data into the delay line 200 to begin generation of the clock pulse signal. The individual delay elements (not shown) in the delay line typically comprise NAND gates that are coupled to an inverter. The shift register 202 is adjusted by a phase detector 204 that compares the replicated clock pulse against the external clock pulse. The phase detector 204 increments or decrements the shift register 202 a fixed amount up and down for each clock cycle, allowing the DLL to iterate until a "lock" with the input external clock signal is attained. When the circuit containing the DLL is powering up or coming out of a low power mode it is not uncommon for 50 or more clock cycles to pass until the feedback based DLL attains a lock with the external clock, delaying initial access to the memory.

Another clock skew adjustment-circuit utilized in DDR SDRAM, that is not feedback based, is a synchronous mirror delay (SMD). A SMD circuit can attain a lock with the external clock signal in as few as two clock cycles. This ability greatly decreases the time to first access when a DDR SDRAM comes out of a low power mode. A SMD circuit generally includes two delay lines and an accompanying control circuit, all of which must be of a length sufficient to accommodate the full time period of the clock pulse to be matched. Any additional space that would be required to allow an adequate adjustment range of the clock period must also be incorporated into the SMD circuit, further increasing the SMD circuit size. Therefore, an SMD circuit generally requires more space to implement on the integrated circuit.

For the reasons stated above, and for other reasons stated below which will become apparent to those skilled in the art upon reading and understanding the present specification, there is a need in the art for a system to reduce clock period matching, or lock times, in integrated circuits with clock skew adjustment circuits. Additionally, there is a need to reduce SMD circuit size in integrated circuits.

SUMMARY OF THE INVENTION

The above-mentioned problems with SMD circuits, particularly with DDR SDRAM that compensate for the latency variation in the DQS signal, and other problems, are addressed by the present invention and will be understood by reading and studying the following specification.

In one embodiment, an SMD circuit comprises a clock source, a delay segment coupled to the clock source, a data path model coupled to the delay segment, a forward delay line coupled to the data path model, an SMD control circuit coupled to the forward delay line and coupled to the clock source, and a backward delay line coupled to the SMD control circuit and coupled to the delay segment.

In another embodiment, an SMD circuit comprises a clock source, a data path model coupled to the clock source, a first delay segment coupled to the data path model, a forward delay line coupled to the first delay segment, an SMD control circuit coupled to the forward delay line and to the clock source, and a backward delay line coupled to the SMD control circuit, the clock source, and to a second delay segment.

In a further embodiment, an integrated circuit comprises a clock input buffer coupled to receive a clock signal with a time period, a delay segment coupled to the clock input buffer, a data path model coupled to the delay segment, a forward delay line coupled to the data path model, an SMD control circuit coupled to the forward delay line and to the clock input buffer, and a backward delay line coupled to the SMD control circuit and coupled to the delay segment.

In yet another embodiment, a memory device comprises an address interface, a data interface, a control interface, and an SMD clock recovery and skew adjustment circuit. The SMD clock recovery and skew adjustment circuit comprises a clock source, a delay segment coupled to the clock source, a data path model coupled to the delay segment, a forward delay line coupled to the data path model, an SMD control circuit coupled to the forward delay line and coupled to the clock source, and a backward delay line coupled to the SMD control circuit and coupled to the delay segment.

In yet a further embodiment, a DDR memory device interface circuit comprises a data interface, a DQS signal interface, a data latch coupled to the data interface, and an SMD clock recovery and skew adjustment circuit coupled to the data latch and coupled to the DQS signal interface. The SMD clock recovery and skew adjustment circuit comprises a clock input buffer coupled to receive a clock signal with a time period, a data path model coupled to the clock input buffer, a first delay segment coupled to the data path model, a forward delay line coupled to the first delay segment, an SMD control circuit coupled to the forward delay line and to the clock input buffer, and a backward delay line coupled to the SMD control circuit, the clock input buffer, and to a second delay segment.

A method of synchronizing with a clock signal comprises receiving a clock signal having a clock signal time period, subtracting a first time period equivalent to a real data path, subtracting a second time period that is a static component, measuring a remaining component of the clock signal time period, reproducing the remaining component of the clock signal time period, and adding a third time period that is identical to the second time period to the reproduced remaining component of the clock signal time period.

Another method of synchronizing with a clock signal comprises receiving a clock signal having a sequential first and second clock signal time period, delaying the first clock signal time period a first time delay, delaying the first clock signal time period a second time delay equal to a real data path, measuring a remaining component of the first clock signal time period, delaying the second clock signal time period the first time delay, reproducing the remaining component of the first clock signal time period, and merging the reproduced remaining component of the clock signal time period to the delayed second clock signal time period.

A further method of synchronizing with a clock signal comprises coupling a delay segment to a clock source, coupling a data path model to the delay segment, coupling a forward delay line to the data path model, coupling an SMD control circuit to the forward delay line and to the clock source, and coupling a backward delay line to the SMD control circuit and to the delay segment.

In yet another method of synchronizing with a clock source comprises coupling a data path model to a clock source, coupling a first delay segment to the data path model, coupling a forward delay line to the first delay segment, coupling an SMD control circuit to the forward delay line and to the clock source, and coupling a backward delay line to the SMD control circuit, the clock source, and to a second delay segment.

A further method of synchronizing a memory device with a clock source comprises forming an address interface, forming a data interface, forming a control interface, and forming an SMD clock recovery and skew adjustment circuit. The SMD clock recovery and skew adjustment circuit comprises coupling a clock input buffer to receive a clock signal coupling a data path model to the clock input buffer, coupling a first delay segment to the data path model, coupling a forward delay line to the first delay segment, coupling an SMD control circuit to the forward delay line and to the clock input buffer, and coupling a backward delay line to the SMD control circuit, the clock input buffer and to a second delay segment.

Another method for synchronizing a DDR memory device interface circuit with a clock source comprises forming a data interface, forming a DQS signal interface, forming a data latch coupled to the data interface, and forming an SMD clock recovery and skew adjustment circuit coupled to the data latch and the DQS signal interface. The SMD clock recovery and skew adjustment circuit comprises, a clock source, a delay segment coupled to the clock source, a data path model coupled to the delay segment, a forward delay line coupled to the data path model, an SMD control circuit coupled to the forward delay line and to the clock source, and a backward delay line coupled to the SMD control circuit and coupled to the delay segment.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
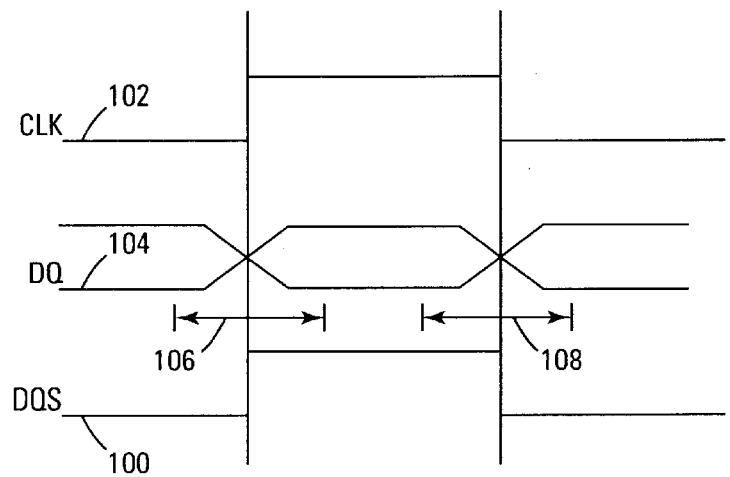
FIG. 1 is a wave diagram of a DDR SDRAM memory transfer showing the system clock signal, data signal (DQ), and DQS strobe.
Figure 2:
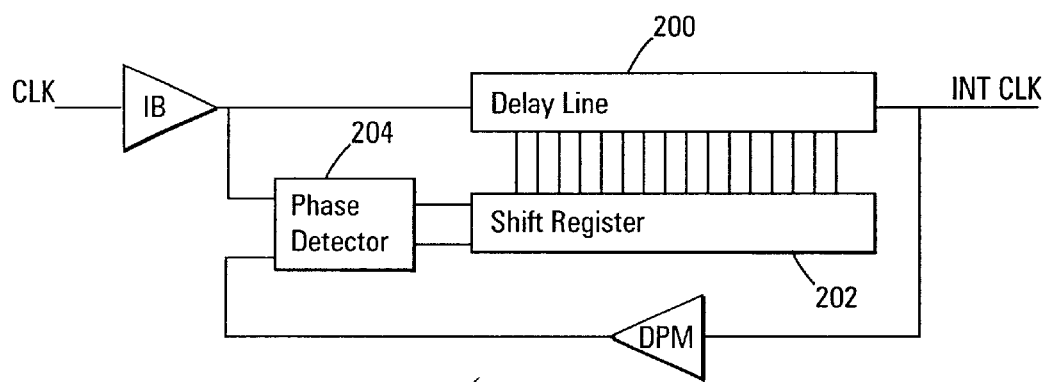
FIG. 2 is a diagram of a prior art DLL for an integrated circuit.
Figure 3:
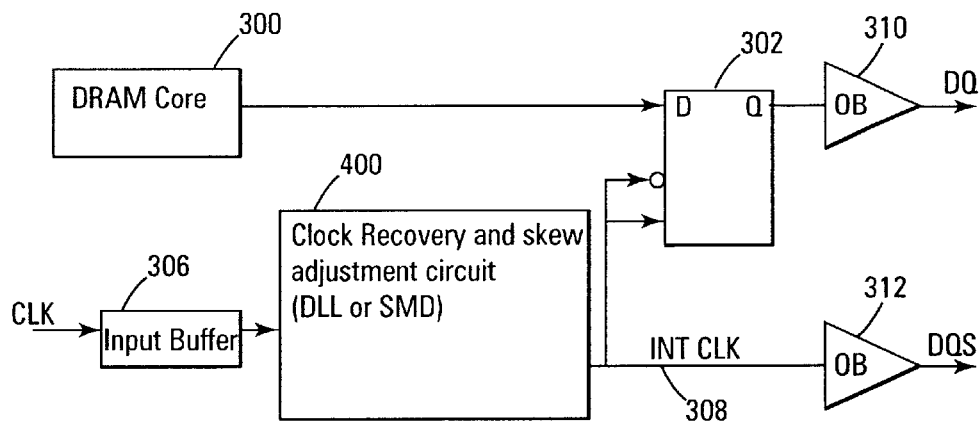
FIG. 3 is a diagram of a DDR SDRAM memory data interface circuit showing DRAM core, data latch, clock recovery circuit, and DQS output.

FIG. 3 shows a generalized data interface of a DDR SDRAM memory, including a DRAM core 300, a data latch 302, and a generalized clock recovery and skew adjustment circuit 304. In operation, an external data clock is received through the clock input buffer 306. The external data clock is replicated and adjusted for skew by the clock recovery and skew adjustment circuit 304 and output as an internal clock signal 308. The internal clock signal 308 is utilized to trigger the data latch 302 on both the rising and falling edge of the clock, outputting data through buffer 310 onto the data bus. The internal clock signal is also utilized to drive the DQS strobe through buffer 312.

Figure 4:
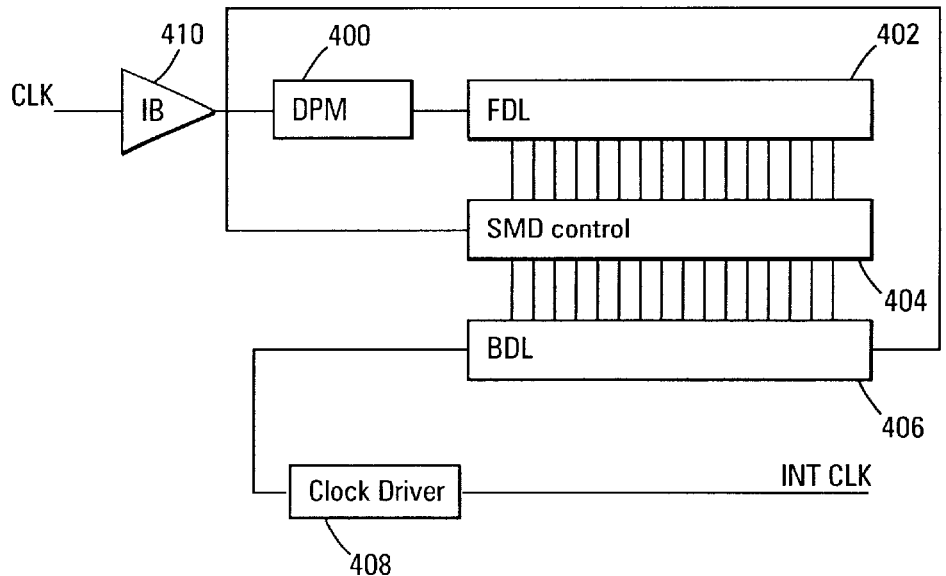
FIG. 4 is a diagram of a prior art SMD circuit.

FIG. 4 shows an example of a prior art SMD circuit which consists of a clock input buffer 410, a data path model (DPM) 400, forward delay line (FDL) 402, an SMD control circuit 404, a backward delay line (BDL) 406, and a clock driver circuit 408. The FDL 402 and BDL 406 are comprised of delay elements (not shown) that have the same unit delay. The input buffer 410 and clock driver 408 adds an additional internal delay for the SMD circuit of $d_{in}$ for the input buffer 410 and delay of $d_{dp}$ for the clock driver circuit 408 to the circuit that is compensated for by the DPM 400.

The SMD circuit receives an external clock signal through the input buffer 410, which couples the received clock signal to the SMD control 404, the DPM 400, and the BDL 406. The received clock signal is passed through the DPM circuit 400, which has a delay of $d_{in}+d_{dp}$, replicating the delays of input buffer 410 and clock driver 408 in order to account for them in the recovery of the clock signal. The clock signal is then passed to the forward delay line (FDL) 402, where it is passed sequentially from delay element to delay element. The combined delay of the DPM 400 and the FDL 402, is such that the forward edge of the received clock signal is still within the FDL 402 when the next external clock signal is received at the input buffer 410. Upon receiving the next external clock signal the input buffer 410 again couples it to the SMD control 404 and the DPM 400 circuits. The next external clock signal enters the DPM circuit 400 and the FDL 402 chain to become the basis of the next recovered clock signal. The next external clock signal also triggers the SMD control 404, which transfers the current clock signal from the position it has attained in the FDL 402 delay chain to the same position in the BDL 406 delay chain. Triggered by the next external clock signal from input buffer 410, the initial clock signal then flows backwards through the BDL 406, which is the same length as the FDL 402 and composed of the same unit delay elements. Because the BDL 406 is the same length as the FDL 402 the clock signal will take the same amount of time to transition through it and will therefore exactly replicate the input clock signal. The additional delay factors of the input buffer 410 and clock driver 408 will already be taken into account in the clock signal loaded into the BDL 406 by the pre-delay of the DPM 400, that effectively subtracts the delay factors from the time period measured by the FDL 402. The recovered and skew adjusted clock signal is coupled from the BDL 406, through the clock driver circuit 408, to provide a synchronous clock for the circuit that the SMD circuit of FIG. 4 is implemented into.

Figure 5:
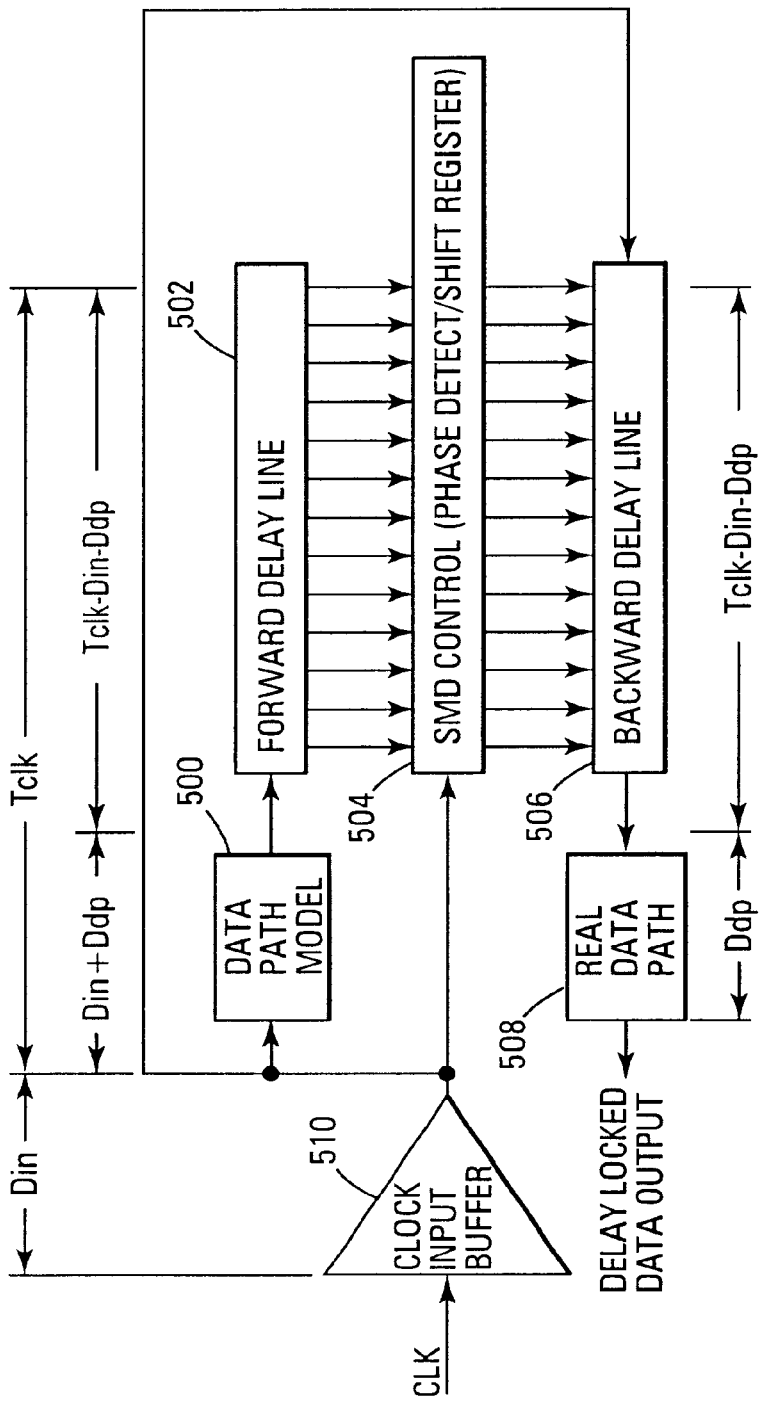
FIG. 5 is a diagram of an SMD circuit.

FIG. 5 shows an example of a SMD circuit which consists of a clock input buffer 510, a data path model (DPM) 500, forward delay line (FDL) 502, a SMD control circuit 504, a backward delay line (BDL) 506, and the real data path (RDP) element 508. The RDP 508 symbolically represents the real data path circuitry delay added by internal circuitry of the system, such as clock drivers and other logic delays, that the SMD circuit of FIG. 5 is implemented into and is not a real circuit component. The FDL 502 and BDL 506 are comprised of delay elements (not shown) that have the same unit delay. The input buffer 510 and real data path 508 add additional internal delays for the SMD circuit, $d_{in}$ for the input buffer 510 and delay of $d_{dp}$ for the RDP 508, that are compensated for by the DPM 500.

The SMD circuit receives an external clock signal through the input buffer 510, which couples the received clock signal to the SMD control 504 and the DPM 500. The received clock signal is passed through the DPM circuit 500, which has a delay of $d_{in}+d_{dp}$, replicating the delays of input buffer 510 and real data path 508 in order to account for them in the recovery of the clock signal. The clock signal is then passed to the forward delay line (FDL) 502, where it is passed sequentially from delay element to delay element. The combined delay of the DPM 500 and the FDL 502, is such that the forward edge of the received clock signal is still within the FDL 502 when the next external clock signal is received at the input buffer 510. Upon receiving the next external clock signal the input buffer 510 again couples it to the SMD control 504 and the DPM 500 circuits. The next external clock signal enters the DPM circuit 500 and the FDL 502 chain to become the basis of the next recovered clock signal. The next external clock signal also triggers the SMD control 504, which transfers the current clock signal from the position it has attained in the FDL 502 delay chain to the same position in the BDL 506 delay chain. The next external clock signal enables the BDL 506 and the initial clock signal then flows backwards through the BDL 506, which is the same length as the FDL 502 and composed of the same unit delay elements. Because the BDL 506 is the same length as the FDL 502 the clock signal will take the same amount of time to transition through it and will therefore exactly replicate the input clock signal. The additional delay factors of the input buffer 510 and clock driver 508 will already be taken into account in the clock signal loaded into the BDL 506 by the pre-delay of the DPM 500, that effectively subtracts the delay factors from the time period measured by the FDL 502. The recovered and skew adjusted clock signal is coupled from the BDL 506 to provide a synchronous clock for the circuit that the SMD circuit of FIG. 5 is implemented into, the delay of which is represented by the real data path 508.

Figure 7A:
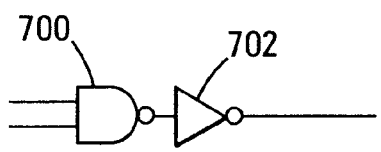
FIG. 7a is a diagram of a NAND delay element and inverter.
Figure 7B:
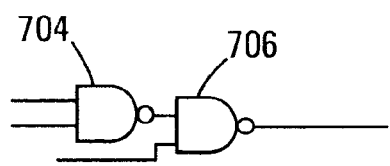
FIG. 7b is a diagram of a two NAND delay element.

Shown in FIGS. 7a and 7b are examples of NAND delay elements, such as would typically be used in either the FDL or the BDL of SMD circuits. The delay element in FIG. 7a comprises a NAND gate 700 coupled to an inverter 702. The delay element in FIG. 7b comprises a first NAND gate 704 coupled to a second NAND gate 706. Additional delay element structures or gate delays that could be utilized, such as, skew limited delays, and etc., will be apparent to those skilled in the art with the benefit of the present specification.

Figure 6A:
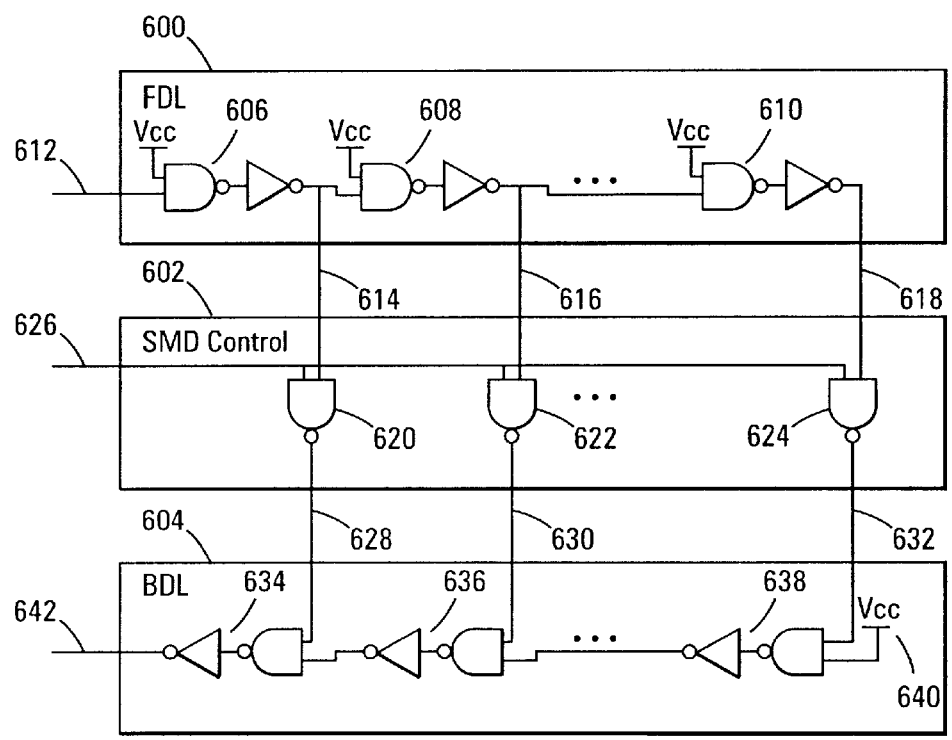
FIG. 6a is detailed diagrams of a FDL, SMD control, and BDL modules for an SMD circuit.
Figure 6B:
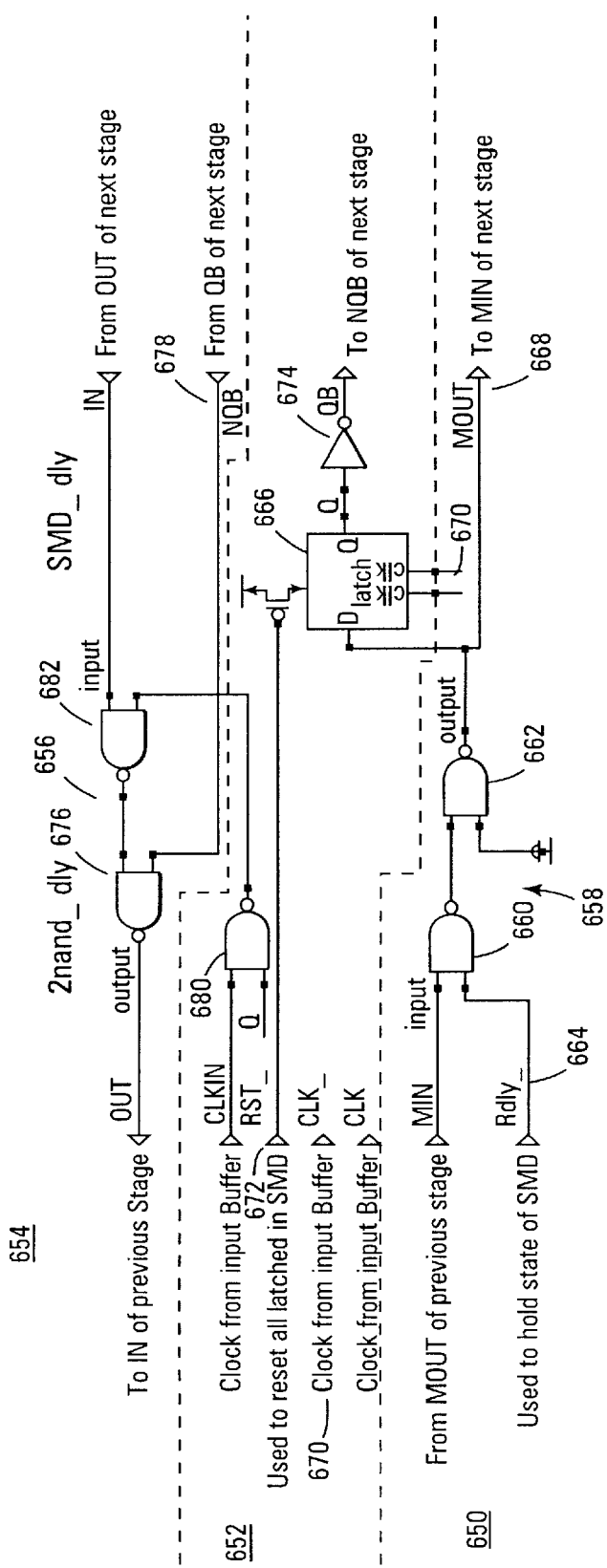
FIGS. 6b and 6c are detailed diagrams of a FDL, a latch based SMD control, and BDL modules for a SMD circuit.

Shown in FIGS. 6a and 6b are expanded example views of the FDL 600, SMD control 602, and BDL 604 of a SMD circuit, to show circuit elements and interconnections. It is understood that the SMD circuits of FIGS. 6a and 6b work in conjunction with the other components that further comprise the SMD circuit such as shown in FIGS. 4 and 5.

In FIG. 6a, the FDL 600 includes a coupled series of such NAND delay elements, 606, 608, and 610. A clock signal enters the FDL 600 on input 612 and is coupled to the NAND gate of the first delay element 606, where the other input is coupled to Vcc. The signal passes through the first delay element 606 and is coupled to the next series delay element 608, which also has its unused input tied to Vcc. The input clock signal is passed in this manner through the FDL 602 until the final delay element 610 is reached. As shown in FIG. 6a, the output of each delay element, 606, 608, and 610, is coupled, 614, 616, and 618, to an input of the SMD control 602. The SMD control 602 consists of a sequence of NAND gates, 620, 622, and 624, that each have an input coupled to a control input 626 that generally accepts a clock signal. The other input to the NAND gates, 620, 622, and 624, of the SMD control 602 is coupled to an input, 614, 616, and 618, respectively, from the FDL 600. The outputs of NAND gates, 620, 622, and 624, is coupled, 628, 630, and 632, to inputs of the series coupled delay elements, 634, 636, and 638, that are incorporated into the BDL 604. When a follow on clock signal is received at the control input 626, the current clock signal that is transitioning the FDL 600 delay element chain is transferred through the SMD control 602 to the same position in the BDL 604 delay element chain. The delay elements, 634, 636, and 638, of the BDL 604 are coupled in series, but flow in an opposite direction from the FDL 600 delay element chain. An input of the initial element 638 in the BDL 604 delay chain is coupled to Vcc 640 to initialize the chain. The transferred clock signal transitions back through the delay elements, 634, 636, and 638, of the BDL 604, and as the BDL 604 has the same number of delay elements as the FDL 600 the clock signal will take the same amount of time to transition to the output 642 of the BDL 604 as it took to get from the input 612 of the FDL 600 to the point at which it was transferred to the BDL 604.

In FIG. 6b one stage of a latch based SMD circuit is shown that comprises a vertical slice of an SMD circuit, detailing an expanded view of FDL 650, BDL 654, and SMD control circuit 652, is shown. The FDL 650 and BDL 654 of FIG. 6b are comprised of dual NAND delay elements, 656 and 658, such as shown in FIG. 7b. An example of an SMD array circuit constructed of the stages of the latch based SMD circuit of FIG. 6b is shown in FIG. 6c.

Figure 6C:
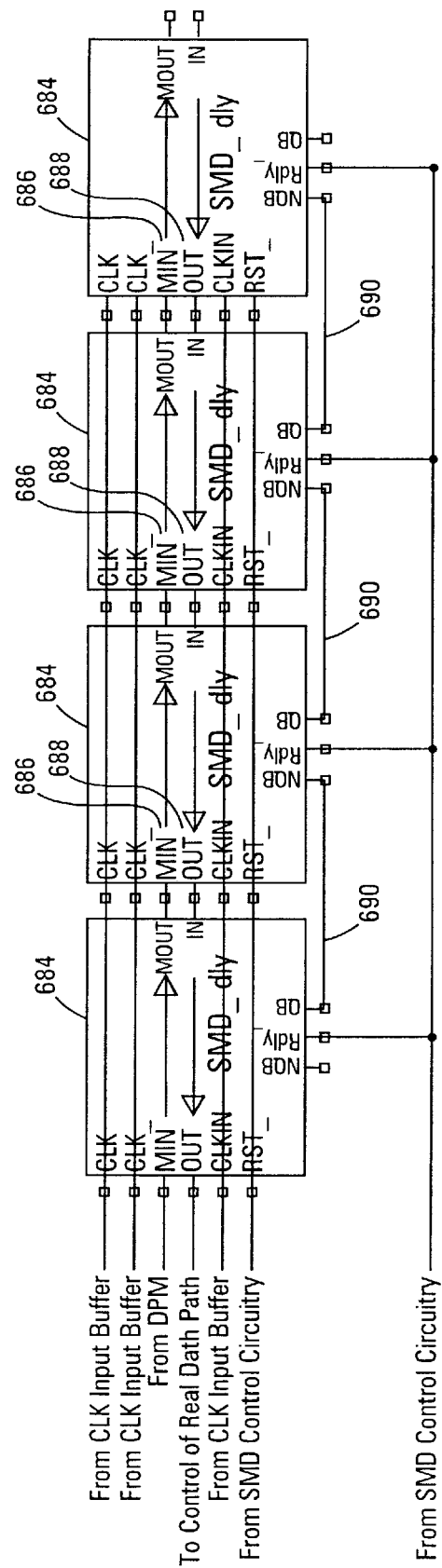

In FIG. 6c, each stage 684 of the SMD array circuit has the FDL 650 output of the stage 684 coupled to the input of the FDL 650 delay element of the next stage 686. This allows an input clock signal to pass sequentially through the SMD array circuit in the FDL 650 from stage to stage. Similarly, the BDL 654 input of each stage 684 coupled to the output of the BDL 654 delay element of the next stage 688, allowing the recovered clock signal to pass sequentially backward through the SMD array circuit in the BDL 654 from stage to stage. Additionally, the output 690 of the SMD control circuit 652 is coupled to the next stage in the SMD array circuit, instead of being transferred directly to the BDL 654 element in the current stage. This allows the SMD array circuit to account for the additional delay of the internal latch and circuitry of each SMD circuit stage 684. All other signals are coupled to the SMD array circuit and individual SMD circuit stages 684 in parallel.

In operation, an incoming clock pulse enters FDL 650 of the SMD circuit containing the SMD circuit stage of FIG. 6b and is passed from delay element to delay element 658. As this occurs, the next clock pulse is applied to the SMD circuit and causes the latch 666 of the SMD control circuit 652 to latch in the position of the current clock pulse in the FDL 650. The SMD control circuit 652 then applies the latched clock pulse to one delay element up in the BDL 654 to adjust for internal delays. The transferred current clock pulse then is passed from delay element to delay element 656 in the BDL 654 until it reaches the coupled external circuit (not shown) that the SMD circuit drives.

In the FDL 650, the first NAND gate 660 of each delay element has an input coupled to receive the incoming clock signal from the previous delay element and an input coupled to receive an active low control input Rdly_664 that is used by external circuitry to hold the state of the SMD. During operation, Rdly_664 is held high allowing the first NAND gate 660 to act logically as an inverter. The output of the first NAND gate 660 is coupled to an input of the second NAND gate 662. The unused input of the second NAND gate 662 is coupled to Vcc (high) to allow the second NAND gate 662 to also act logically as an inverter, re-inverting the clock signal that is passed to it from the first NAND gate 660. The output of the second NAND gate 662 is coupled to an input of latch 666 of the SMD control circuit 652 and to input 668 of the delay element (not shown) of the next stage of the FDL 650.

The SMD control circuit latch 666 latches in the output from the second NAND gate 662 of the FDL 650 on the rising and falling edges of the input clock signal 670. On a rising clock edge the latch 666 will latch in a zero from the FDL delay chain 650. On a falling clock edge the latch 666 will latch in the position of the clock pulse that is transitioning the FDL delay element coupled to it. An active low reset signal, RST_672, is provided to clear or preset the contents of the latches 666 the SMD control circuit 652, such as upon startup. The output of the SMD control circuit latch 666 is coupled to the delay element of the next stage (not shown) of the BDL 654 through inverter 674.

The BDL 654 circuit delay element chain flows in an opposite direction from the FDL 650 delay element chain. The inverted clock signal latched in the previous delay stage SMD control circuit latch (not shown) is placed on the NQB input 678 and is coupled into the BDL 654 delay circuit element 656 through the second NAND gate 676 of the BDL 654 delay element 656. The next clock pulse is gated in by NAND gate 680, placing a zero (low) signal on the coupled input of the first NAND gate 682 setting its output to a logical one (high). The logical one on the output of the first NAND gate 682 is coupled to an input of the second NAND gate 676 of the BDL 656 making it logically act like an inverter to the coupled inverted signal from the NBQ input 678 from the previous stage of the SMD circuit (not shown) transferring the latched clock signal from the FDL 650 to the BDL 654. When the next clock pulse transitions to zero the NAND gate 680 and latch of the next stage (not shown) present a one (high) to the inputs of the second and first NAND gates, 676 and 682, respectively, of the BDL 654. This allows them to logically act as inverters and the transferred clock signal starts to transition back through the delay elements of the BDL 656. As the BDL 654 has the same number of delay elements as the FDL 650 the clock signal will take the same amount of time to transition to the output of the BDL 654 as it took to get from the input of the FDL 650 to the point at which it was transferred to the BDL 654.

Figure 9A:
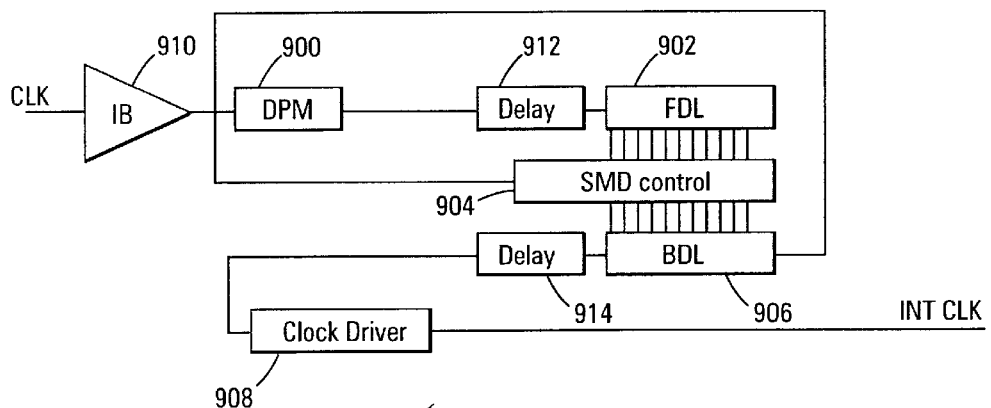
FIGS. 9a and 9b are diagrams of an SMD circuit with embodiments of the present invention.

FIG. 9a shows an SMD circuit with an embodiment of the present invention. The SMD circuit of FIG. 9a consists of a clock input buffer 910, a data path model (DPM) 900, forward delay line (FDL) 902, a SMD control circuit 904, a backward delay line (BDL) 906, a clock driver circuit 908, and two delay segments 912 and 914. The FDL 902 and BDL 906 are comprised of delay elements (not shown) that have the same unit delay. The input buffer,910 and clock driver 908 adds an additional internal delay for the SMD circuit of $d_{in}$ for the input buffer 910 and delay of $d_{dp}$ for the clock driver circuit 908 to the circuit that is compensated for by the DPM.

In the SMD circuit of FIG. 9a, the delay segments 912 and 914 provide a fixed delay for the FDL 902 and BDL 906 respectively of the SMD circuit. The fixed delay segments 912 and 914 are designed to incorporate a portion of the clock signal time period from the FDL 902 and BDL 906, allowing them to be smaller and have less internal delay elements. Alternatively, the internal delay elements of the FDL 902 and BDL 906 could have a smaller unit delay and therefore allow a finer, higher granularity match with the input clock signal. In addition, the fixed delay segments 912 and 914 can be designed to incorporate a time period greater than, or several multiples of, the input clock period. This could be done, for example, to account for a clock input circuit that has a delay of multiple clock time periods. In practice, the fixed delay time period of the delay segments is optimally chosen to incorporate as much of the unchanging portion of the external clock time period as possible. This permits the FDL 902 and BDL 906 to be only long enough to incorporate the portion of the clock signal time period that must be adjusted for, allowing an SMD circuit of a smaller size than that of a similar conventional SMD circuit.

In FIG. 9a, the SMD circuit receives an external clock signal through the input buffer 910, which couples the received clock signal to the SMD control 904, the DPM 900, and the BDL 906. The received clock signal is passed through the DPM circuit 900, which has a delay of $d_{in}+d_{dp}$, replicating the delays of input buffer 910 and clock driver 908 in order to account for them in the recovery of the clock signal. The clock signal is then passed to delay segment 912. Delay segment 912 couples the signal to the forward delay line (FDL) 902, where it is internally passed from delay element to delay element. The combined delay of the DPM 900, delay segment 912, and the FDL 902, is such that the forward edge of the received clock signal is within the FDL 902 when the next external clock signal is received at the input buffer 910. Upon receiving the next external clock signal the input buffer 910 again couples it to the SMD control 904, the DPM 900, and the BDL 906 circuits. The next external clock signal enters the DPM circuit 900, delay segment 912, and FDL 902 chain to become the basis of the next recovered clock signal. The coupled next external clock signal also triggers the SMD control 904, which transfers the initial clock signal from the position it has attained in the FDL 902 delay chain to the same position in the BDL 906 delay chain. Triggered by the next external clock signal coupled from the input buffer 910, the current clock signal then flows backwards through the BDL 906 and delay segment 914, which are the same length as the FDL 902 and delay segment 912, and are composed of the same unit delay elements. It is noted that the next external clock signal could also be coupled through the SMD control 904 instead of directly from the input buffer 910. The adjusted clock signal is then coupled from delay segment 914 to the internal clock driver circuit 908. Because the BDL 906 and delay segment 914 are the same length as the FDL 902 and delay segment 912 the clock signal will take the same amount of time to transition through it and will therefore exactly replicate the input clock signal. The additional delay factors of the input buffer 910 and clock driver 908 will already be taken into account in the clock signal loaded into the BDL 906 by the SMD control 904 by the pre-delay of the DPM 900, that effectively subtracts them from the time period measured by the FDL 902. The recovered and skew adjusted clock signal is coupled from the clock driver circuit 908 to provide a synchronous clock for the circuit that the SMD circuit of FIG. 9a is implemented into.

It is noted in the SMD circuit of FIG. 9a, that the delay segments 912 and 914 and the DPM 900 can have multiple placements in the circuit and still achieve the same functionality. For example, the delay segment 912 can be placed before the DPM 900. In addition, the delay segment 914 could be coupled before the BDL 906, or split to have an element coupled both before and after the BDL 906. Additional combinations of the delay segments 912 and 914 and the DPM 900 will be apparent to those skilled in the art with the benefit of the present specification.

Figure 9B:
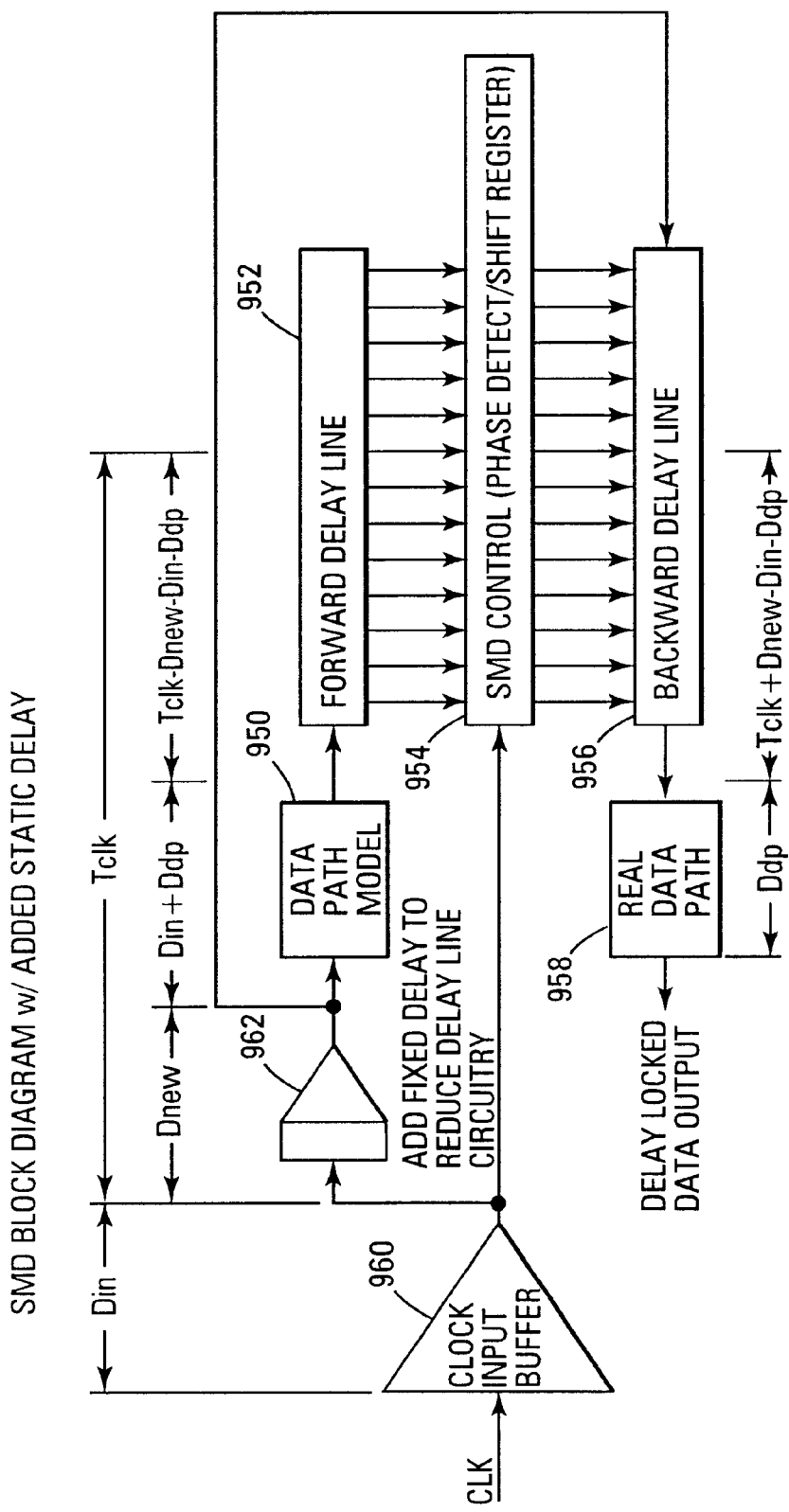

FIG. 9b shows another SMD circuit with another embodiment of the present invention. The SMD circuit of FIG. 9b consists of a clock input buffer 960, a data path model (DPM) 950, forward delay line (FDL) 952, an SMD control circuit 954, a backward delay line (BDL) 956, a delay segment 962, and the real data path (RDP) element 958. For the SMD circuit of FIG. 9b, the RDP 958 represents the real data path delay added by internal circuitry of the system that the SMD circuit of FIG. 9b is coupled to and that the DPM 950 element models. The FDL 952 and BDL 956 are comprised of delay elements (not shown) that-have the same unit delay. The input buffer 960 and real data path 958 adds an additional internal delay for the SMD circuit of $d_{in}$ for the input buffer 960 and delay of $d_{dp}$ for the RDP 958 to the circuit that is compensated for by the DPM 950.

In the SMD circuit of FIG. 9b, the delay segment 962 provides a fixed delay for the FDL 952 and BDL 956 respectively of the SMD circuit. The fixed delay segment 962 is designed to incorporate a portion of the clock signal time period from the FDL 952 and BDL 956, allowing them to be smaller and have less internal delay elements and have less control elements. Alternatively, the internal delay elements of the FDL 952 and BDL 956 could have a smaller unit delay and therefore allow a finer, higher granularity match with the input clock signal. In addition, the fixed delay segment 962 can be designed to incorporate a time period greater than, or several multiples of, the input clock period. This could be done, for example, to account for a clock input circuit that has a delay of multiple clock time periods. In practice, the fixed delay time period of the delay segments is optimally chosen to incorporate as much of the unchanging portion of the external clock time period as possible. This permits the FDL 952 and BDL 956 to be only long enough to incorporate the portion of the clock signal time period that must be adjusted for, allowing an SMD circuit of a smaller size than that of a similar conventional SMD circuit.

In FIG. 9b, the SMD circuit receives an external clock signal through the input buffer 960, which couples the received clock signal to the SMD control 954 and the delay segment 962. Delay segment 962 couples the signal to the DPM 950 which has a delay of $d_{in}+d_{dp}$, replicating the delays of input buffer 960 and real data path (RDP) element 958 in order to account for them in the recovery of the clock signal. Delay segment 962 also couples the clock signal to the backward delay line (BDL) 956. The DPM 950 couples the clock signal to the forward delay line (FDL) 952, which passes the clock signal internally from delay element to delay element (not shown). The combined delay of the delay segment 962, DPM 950, and the FDL 952, is such that the forward edge of the received clock signal is within the FDL 952 when the next external clock signal is received at the input buffer 960. Upon receiving the next external clock signal the input buffer 960 again couples it to the SMD control 954 and the delay segment 962 circuits. The next clock signal enters the delay segment 962, DPM circuit 950, and FDL 952 chain to become the basis of the next recovered clock signal. The coupled next clock signal also triggers the SMD control 954, which transfers the initial clock signal from the position it has attained in the FDL 952 delay chain to the same position in the BDL 956 delay chain, which passes it backwards from delay element to delay element (not shown). The adjusted forward edge of the current clock signal then flows from the BDL 956, with the remainder of the current clock signal flowing through the BDL 956 from delay segment 962. The adjusted clock signal is then coupled from the BDL 956 to the circuitry that the SMD circuit of FIG. 9b drives, represented by the real data path (RDP) element 958. Because the combined time delay of the BDL 956 and delay segment 962 are the same length as the combined time delay of the FDL 952 and delay segment 962, less the time delay of the DPM 950, the clock signal will take the same amount of time to transition through it. The additional delay factors of the input buffer 960 and real data path (RDP) element 958 will already be taken into account in the clock signal loaded into the BDL 956 by the pre-delay of the DPM 950, that effectively subtracts them from the time period measured by the FDL 952. The recovered and skew adjusted clock signal is coupled from the BDL 956 to provide a synchronous clock for the circuit that the SMD circuit of FIG. 9b is implemented into.

Figure 8:
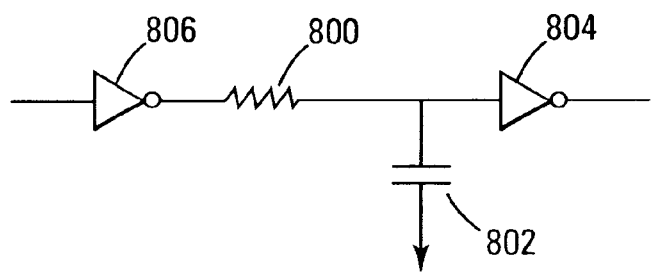
FIG. 8 is a diagram of a RC delay element, showing resistor, capacitor and inverter.

Shown in FIG. 8 is an example of a RC delay element that is typically utilized in the delay segments 912 and 914 of FIG. 9a and in the delay segment 962 of FIG. 9b. The RC delay element of FIG. 8 comprises inverters 806 and 804, a resistor 800, and a capacitor 802. Inverter 806 is coupled to resistor 800, which is in turn coupled to capacitor 802 and inverter 804. Capacitor 802 is coupled to a ground to form a RC circuit with resistor 800. In operation, a clock'signal enters the RC delay element of FIG. 8 and is coupled to inverter 806. The clock signal passes through inverter 806 and charges capacitor 802 through resistor 800. When the capacitor 802 is charged or discharged by inverter 806, depending on the clock signal phase being transmitted, the delayed clock signal passes through coupled inverter 804 and exits the RC delay element. Additional delay element structures or gate delays that could be utilized, such as, skew limited delays, and etc., will be apparent to those skilled in the art with the benefit of the present specification.

Figure 10:
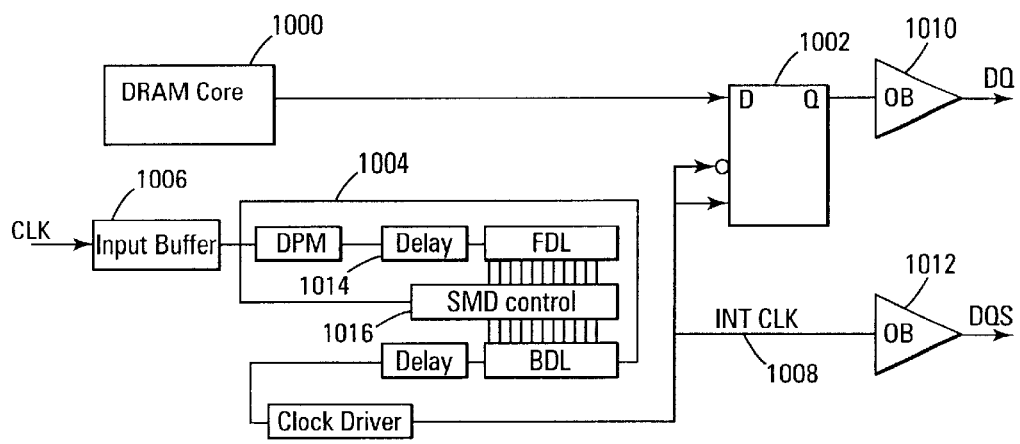
FIG. 10 is a diagram of a DDR SDRAM memory data output circuit showing DRAM core, data latch, SMD clock recovery circuit, and DQS output.

FIG. 10 shows a diagram of a data output stage, such as that in FIG. 3, which incorporates an embodiment of the present invention. The output stage of FIG. 10 shows a DDR SDRAM memory, including a DRAM core 1000, a data latch 1002, and an SMD clock recovery and skew adjustment circuit 1004 that incorporates delay segments, 1014 and 1016, such as described in FIG. 9a. Alternative SMD clock recovery and skew adjustment circuits of the present invention, such as that of FIG. 9b, could also be used. In FIG. 10, the delay segments 1014 and 1016 represent the non-variable portion of the clock signal, allowing for a more space efficient SMD circuit implementation. In operation an external data clock is received through the clock input buffer 1006. The external data clock is replicated and adjusted for skew by the SMD clock recovery and skew adjustment circuit 1004 and output as an internal clock signal 1008. The internal clock signal 1008 is utilized to trigger the data latch 1002 on both the rising and falling edge of the clock, outputting data through buffer 1010 onto the data bus. The internal clock signal is also utilized to drive the DQS strobe through buffer 1012.

Figure 11:
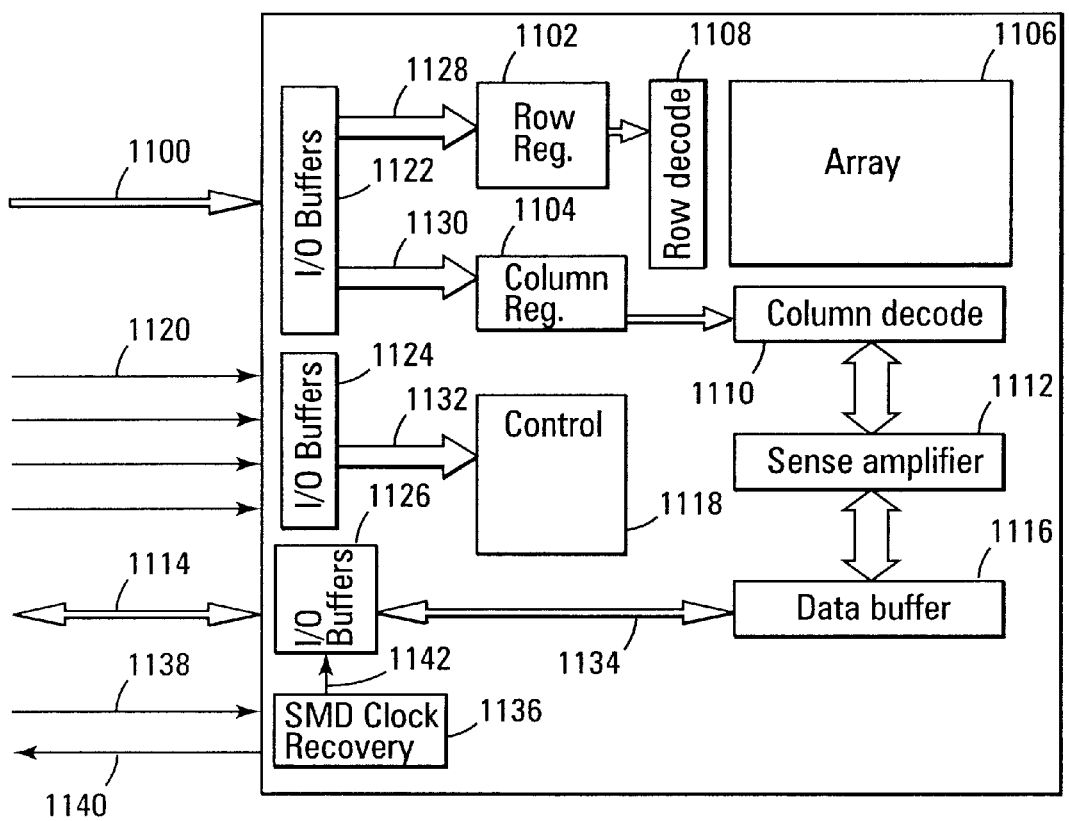
FIG. 11 is a diagram of a memory with an SMD clock recovery circuit.

FIG. 11 shows an illustration of a non-volatile memory device of an embodiment of the present invention. It is noted that the memory device of FIG. 11 is only shown as an example, and embodiments of the present invention can include multiple types of other integrated circuits (i.e., a processor, a volatile memory device, an ASIC, etc.). Memory devices are well known in the prior art and the following description is intended only to be an overview of their operation and provide an example of their operation with an embodiment of the present invention.

The non-volatile memory device of FIG. 11 contains an array of nonvolatile floating gate memory cells arranged in columns coupled to bit lines as its main memory structure. In the memory device of FIG. 11, address values for the memory are received on the external address bus connections 1100. The received address values are stored internal to the memory device and utilized to select the memory cells in the array to read and write data to. In the case of the memory device of FIG. 11, the internal address register is shown split with both a row address register 1102 and column address register 1104. The address values held in the row address register 1102 and column address register 1104, select a data word from the non-volatile memory cell array 1106 through the coupled row decode 1108 and column decode 1110 circuits. The selected data word is read by the coupled sense amplifier circuit 1112. Data values for the memory device of FIG. 11 are received and transmitted on the bi-directional data word interface 1114. Internal to the memory device, data to be written to or from the memory array 1106 is held in the Data buffer 1116. Control of the memory device of FIG. 11 for both read operations and write operations is actuated by the internal control circuit 1118. The control circuit 1118 operates in response external control signals received on control signal external interface connections 1120 and to internal events. As shown in FIG. 11, all external signal connections to the memory device are coupled to internal I/O buffers on the integrated circuit chip (1122, 1124, and 1126). I/O buffers are shown for each of the major interfaces, address I/O buffers 1122, data I/O buffers 1126, and control signal I/O buffers 1124. Interconnect lines (1128, 1130, 1132, and 1134) couple the I/O buffers (1122, 1124, and 1126) to their corresponding active component input circuits that accept the incoming signals. The non-volatile memory device of FIG. 11 is shown integrating an SMD clock recovery and skew adjustment circuit 1136 that incorporates an embodiment of the present invention. An external clock signal 1138 is coupled to the SMD clock recovery and skew adjustment circuit 1136, which recovers and skew adjusts the external clock. The SMD clock recovery and skew adjustment circuit 1136 also asserts a DQS strobe signal 1140 and an internal clock signal 1142, when the non-volatile memory circuit of FIG. 11 is accessed.

CONCLUSION

A synchronous mirror delay (SMD) clock recovery and skew adjustment circuit for an integrated circuit is described, having a reduced circuit implementation. The SMD clock recovery and skew adjustment circuit incorporates a delay segment into the forward delay line (FDL) and backward delay line (BDL) that accounts for all or some of the non-variable portion of the asserted clock signal time period. This delay segment allows reduction of the FDL and BDL lines to only those portions necessary to sense and adjust for the portion of the inserted clock signal time period that is variable and that must be adjusted for. The described invention allows SMD clock recovery and skew adjustment circuits to be implemented in an optimized manner that exhibits a reduced overall circuit size.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An SMD circuit comprising:
   a clock source;
   a data path model coupled to the clock source;
   a first delay segment coupled to the data path model;
   a forward delay line coupled to the first delay segment;
   an SMD control circuit coupled to the forward delay line and to the clock source; and
   a backward delay line coupled to the clock source, the SMD control circuit, and coupled to a second delay segment.

2. The SMD circuit of claim 1, wherein the first and second delay segments has a time delay that is a fraction of a time period of the clock source.

3. The SMD circuit of claim 1, wherein the first and second delay segments has a time delay that is larger than a time period of the clock source.

4. The SMD circuit of claim 1, wherein the first and second delay segments further comprise at least one unit delay element.

5. The SMD circuit of claim 4, wherein the at least one unit delay element further comprises a RC delay element.

6. The SMD circuit of claim 4, wherein the at least one unit delay element further comprises a skew limited delay element.

7. The SMD circuit of claim 1, wherein the first delay segment is coupled to the clock source, the data path model is coupled to the first delay segment, and the data path model is coupled to the forward delay line.

8. The SMD circuit of claim 1, wherein the second delay segment is coupled to the clock source, the backward delay line is coupled to the second delay segment.

9. The SMD circuit of claim 1, wherein the forward delay line and the backward delay line further comprises at least one delay element.

10. The SMD circuit of claim 9, wherein the at least one delay element further comprises a NAND gate coupled to an inverter.

11. The SMD circuit of claim 9, wherein the at least one delay element further comprises a first NAND gate coupled to a second NAND gate.

12. The SMD circuit of claim 1, wherein the SMD control circuit further comprises at least one NAND gate, wherein an input of the NAND gate is coupled to a control circuit, another input of the NAND gate is coupled to an output of a delay element of the forward delay line, and an output of the NAND gate is coupled to an input of a delay element of the backward delay line.

13. The SMD circuit of claim 1, wherein the SMD control circuit further comprises at least one latch, wherein a clock input of the latch is coupled to a control circuit, an input of the latch is coupled to an output of a delay element of the forward delay line, and an output of the latch is coupled to an input of a delay element of the backward delay line.

14. An integrated circuit comprising:
   a clock input buffer coupled to receive a clock signal with a time period;
   a data path model coupled to the clock input buffer;
   a first delay segment coupled to the data path model;
   a forward delay line coupled to the first delay segment;
   an SMD control circuit coupled to the forward delay line and to the clock input buffer; and
   a backward delay line coupled to the SMD control circuit, the clock input buffer, and to a second delay segment.

15. The integrated circuit of claim 14, wherein the first and second delay segments have a time delay that is a sub-part of the time period of the clock signal.

16. The integrated circuit of claim 14, wherein the first or second delay segments have a time delay that is greater than the time period of the clock signal.

17. The integrated circuit of claim 14, wherein the first or second delay segments further comprise at least one unit delay element.

18. The integrated circuit of claim 14, wherein the at least one unit delay element further comprises a RC delay element.

19. The integrated circuit of claim 17, wherein the at least one unit delay element further comprises a skew limited delay element.

20. The integrated circuit of claim 14, wherein the first delay segment is coupled to the clock input buffer, the data path model is coupled to the first delay segment, and the data path model is coupled to the forward delay line.

21. The integrated circuit of claim 14, wherein the second delay segment is coupled to the clock input buffer, the backward delay line is coupled to the second delay segment.

22. The integrated circuit of claim 14, wherein the forward delay line and the backward delay line further comprises at least one delay element.

23. The integrated circuit of claim 22, wherein the delay element further comprises a NAND gate coupled to an inverter.

24. The integrated circuit of claim 22, wherein the delay element further comprises a first NAND gate coupled to a second NAND gate.

25. The integrated circuit of claim 14, wherein the SMD control circuit further comprises at least one NAND gate, wherein an input of the NAND gate is coupled to the clock input buffer, another input of the NAND gate is coupled to an output of a delay element of the forward delay line, and an output of the NAND gate is coupled to an input of a delay element of the backward delay line.

26. The integrated circuit of claim 14, wherein the SMD control circuit further comprises at least one latch, wherein a clock input of the latch is coupled to the clock input buffer, an input of the latch is coupled to an output of a delay element of the forward delay line, and an output of the latch is coupled to an input of a delay element of the backward delay line.

27. A memory device comprising:
   an address interface;
   a data interface;
   a control interface; and
   a SMD clock recovery and skew adjustment circuit comprising,
      a clock input buffer coupled to receive a clock signal,
      a data path model coupled to the clock input buffer,
      a first delay segment coupled to the data path model,
      a forward delay line coupled to the first delay segment,
      an SMD control circuit coupled to the forward delay line and to the clock input buffer, and
      a backward delay line coupled to the SMD control circuit, the clock input buffer, and to a second delay segment.

28. The memory device of claim 27, wherein the memory device comprises nonvolatile memory.

29. The memory device of claim 27, wherein the memory device comprises synchronous memory.

30. The memory device of claim 29, wherein the memory device comprises SDRAM memory.

31. The memory device of claim 29, wherein the memory device comprises DDR memory.

32. The memory device of claim 27, wherein the data interface further comprises a data latch coupled to the SMD clock recovery and skew adjustment circuit.

33. The memory device of claim 27, wherein the data interface further comprises a DQS strobe circuit coupled to the SMD clock recovery and skew adjustment circuit.

34. A DDR memory device interface circuit comprising:
a data interface;
a DQS signal interface;
a data latch coupled to the data interface; and
an SMD clock recovery and skew adjustment circuit coupled to the data latch and coupled to the DQS signal interface, wherein the SMD clock recovery and skew adjustment circuit comprises,
a clock input buffer coupled to receive a clock signal with a time period,
a data path model coupled to the clock input buffer,
a first delay segment coupled to the data path model,
a forward delay line coupled to the first delay segment,
an SMD control circuit coupled to the forward delay line and to the clock input buffer, and
a backward delay line coupled to the SMD control circuit, the clock input buffer, and to a second delay segment.

35. The DDR memory device interface circuit of claim 34, wherein the DDR memory device interface circuit is implemented in an ASIC.

36. The DDR memory device interface circuit of claim 34, wherein the DDR memory device interface circuit is implemented in a memory device.

37. The DDR memory device interface circuit of claim 36, wherein the memory device is a DDR memory device.

38. The DDR memory device interface circuit of claim 34, wherein the DDR memory device interface circuit is implemented in a non-volatile memory device.

39. A method of synchronizing with a clock source comprising:
coupling a data path model to a clock source;
coupling a first delay segment to the data path model;
coupling a forward delay line to the first delay segment;
coupling an SMD control circuit to the forward delay line and to the clock source; and
coupling a backward delay line to the SMD control circuit and to a second delay segment.

40. The method of claim 39, wherein the first and second delay segments has a time delay that is a portion of a time period of the clock source.

41. The method of claim 39, wherein the first and second delay segments has a time delay that is larger than a time period of the clock source.

42. The method of claim 39, wherein forming the first or second delay segment further comprises forming at least one delay element.

43. The method of claim 42, wherein forming the at least one delay element further comprise forming a RC delay element.

44. The method of claim 42, wherein forming the at least one delay element further comprise forming a skew limited delay element.

45. The method of claim 39, wherein forming the forward delay line and the backward delay line further comprises forming at least one delay element.

46. The method of claim 45, wherein forming the delay element further comprises forming a NAND gate coupled to an inverter.

47. The method of claim 45, wherein forming the delay element further comprises forming a first NAND gate coupled to a second NAND gate.

48. The method of claim 39, wherein forming the SMD control circuit further comprises forming at least one NAND gate, wherein an input of the NAND gate is coupled to a control line, another input of the NAND gate is coupled to an output of a delay element of the forward delay line, and an output of the NAND gate is coupled to an input of a delay element of the backward delay line.

49. The method of claim 39, wherein forming the SMD control circuit further comprises forming at least one latch, wherein an input of the latch is coupled to a control line, another input of the latch is coupled to an output of a delay element of the forward delay line, and an output of the latch is coupled to an input of a delay element of the backward delay line.

50. The method of claim 45, further comprising minimizing the number of delay elements in the forward and backward delay lines.

51. The method of claim 45, further comprising increasing adjustment granularity by decreasing a time delay of the delay elements in the forward and backward delay lines.

52. The method of claim 39, further comprising selecting the first and second delay segments to minimize the circuit size of the forward and backward delay lines.

53. The method of claim 39, further comprising selecting the first and second delay segments to match a non-variable portion of the time period of the clock source.

54. The method of claim 53, further comprising selecting the first and second delay elements to maximize the matched non-variable portion of the time period of the clock source.

55. A method of synchronizing a memory device with a clock source comprising:
forming an address interface;
forming a data interface;
forming a control interface; and
forming an SMD clock recovery and skew adjustment circuit comprising,
coupling a clock input buffer to receive a clock signal,
coupling a data path model to the clock input buffer,
coupling a first delay segment to the data path model,
coupling a forward delay line to the first delay segment,
coupling an SMD control circuit to the forward delay line and to the clock input buffer, and
coupling a backward delay line to the SMD control circuit and to a second delay segment.

56. The method of claim 55, wherein the memory device comprises non-volatile memory.

57. The method of claim 55, wherein the memory device comprises synchronous memory.

58. The memory device of claim 57, wherein the memory device comprises SDRAM memory.

59. The memory device of claim 57, wherein the memory device comprises DDR memory.

60. The method of claim 55, wherein forming the data interface further comprises forming a data latch and coupling the data latch to the SMD clock recovery and skew adjustment circuit.

61. The method of claim 55, wherein forming the data interface further comprises forming a DQS strobe circuit and coupling it to the SMD clock recovery and skew adjustment circuit.

62. A method for synchronizing a DDR memory device interface circuit with a clock signal comprising:
forming a data interface;
forming a DQS signal interface;
forming a data latch coupled to the data interface; and
forming an SMD clock recovery and skew adjustment circuit coupled to the data latch and the DQS signal interface, wherein the SMD clock recovery and skew adjustment circuit comprises,
a clock input buffer coupled to receive a clock signal,
a data path model coupled to the clock input buffer,
a first delay segment coupled to the data path model,
a forward delay line coupled to the first delay segment,
an SMD control circuit coupled to the forward delay line and to the clock input buffer, and
a backward delay line coupled to the SMD control circuit and coupled to a second delay segment.

* * * * *